(12) United States Patent
Tanaka et al.

(10) Patent No.: US 7,895,484 B2
(45) Date of Patent: Feb. 22, 2011

(54) SEMICONDUCTOR DEVICE, MEMORY SYSTEM AND CONTROL METHOD OF THE SEMICONDUCTOR DEVICE

(75) Inventors: Hiroyuki Tanaka, Kasugai (JP); Yuji Nakagawa, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 264 days.

(21) Appl. No.: 12/186,140

(22) Filed: Aug. 5, 2008

(65) Prior Publication Data

US 2009/0083592 A1 Mar. 26, 2009

(30) Foreign Application Priority Data

Sep. 26, 2007 (JP) ............................. 2007-248894

(51) Int. Cl.
G11C 29/00 (2006.01)
(52) U.S. Cl. ............................. 714/718; 714/5; 714/25; 714/30; 714/42; 714/702; 714/719; 714/733; 714/734; 714/744; 711/2; 711/3; 711/5; 711/6; 711/200; 711/211; 365/201
(58) Field of Classification Search ........................ None
See application file for complete search history.

(56) References Cited

U.S. PATENT DOCUMENTS

| | | | | |
|---|---|---|---|---|
| 4,967,387 | A * | 10/1990 | Shibasaki et al. ........... 702/120 |
| 6,141,271 | A * | 10/2000 | Yoon et al. ................... 365/201 |
| 6,226,764 | B1 * | 5/2001 | Lee ............................. 714/718 |
| 6,457,141 | B1 * | 9/2002 | Kim et al. ..................... 714/30 |
| 7,228,470 | B2 | 6/2007 | Saito |
| 7,366,965 | B2 | 4/2008 | Yamasaki et al. |
| 7,461,242 | B2 * | 12/2008 | Grossman et al. ........... 712/228 |
| 7,676,709 | B2 * | 3/2010 | Chan .......................... 714/719 |
| 2005/0060621 | A1 * | 3/2005 | Lee et al. .................... 714/718 |

FOREIGN PATENT DOCUMENTS

JP 2004-246979 A 9/2004
JP 2005-078657 A 3/2005

* cited by examiner

*Primary Examiner*—John P Trimmings
(74) *Attorney, Agent, or Firm*—Arent Fox LLP (57) ABSTRACT

A semiconductor device including a logic circuit and a test circuit is provided which comprises: a logic signal terminal that supplies a signal to the logic circuit; a latch circuit that latches a signal based on a synchronization signal from the test circuit; a first selection circuit that supplies an external signal from the logic signal terminal to one of the logic circuit and the latch circuit selectively based on a test mode signal; and a second selection circuit that supplies one of the external signal and a signal from the test circuit selectively to a memory.

20 Claims, 9 Drawing Sheets

SEMICONDUCTOR DEVICE, MEMORY SYSTEM AND CONTROL METHOD OF THE SEMICONDUCTOR DEVICE

CROSS-REFERENCE TO RELATED APPLICATIONS

This application claims the benefit of priority from Japanese Patent Application No. 2007-248894 filed on Sep. 26, 2007, the entire contents of which are incorporated herein by reference.

BACKGROUND OF THE INVENTION

1. Field of the Invention

The present application relates to a semiconductor device that includes a Built In Self Test (BIST) for automatically performing an operation test of a memory.

2. Description of Related Art

As the demand for semiconductor device miniaturization continues to increase, System-in-Package (SiP) type semiconductor devices have become more prevalent. Moreover, Multi-Chip Package (MCP) products in which devices of various functions are integrated into a single package have been produced.

A SiP product provided with the BIST automatically performs an operation test of a memory on a chip having the BIST or of a memory on a different chip provided within the same package by using a test pattern of the BIST. Such techniques are disclosed in Japanese Laid-open Patent Publication No. 2004-246979, Japanese Laid-open Patent Publication No. 2005-78657 and so on.

SUMMARY

In one aspect of an embodiment, a semiconductor device including a logic circuit and a test circuit is provided which comprises a logic signal terminal that supplies a first signal to the logic circuit; a latch circuit that latches a second signal based on a synchronization signal from the test circuit; a first selection circuit that supplies an external signal from the logic signal terminal to one of the logic circuit and the latch circuit selectively based on a test mode signal; and a second selection circuit that supplies one of the external signal and a signal from the test circuit selectively to a memory.

Additional advantages and novel features of the invention will be set forth in part in the description that follows, and in part will become more apparent to those skilled in the art upon examination of the following or upon learning the various aspects of the invention.

DESCRIPTION OF PREFERRED EMBODIMENTS

A Built In Self Test (BIST) automatically performs an operation test of a memory at high speed based on a test pattern set in advance. Test patterns such as an address pattern, write data, or the like, which perform the operation test of the memory are set in advance to the BIST. The BIST performs the operation test of the memory at a high speed based on a minimal control signal such as a test mode signal supplied from a tester device or the like. In this way, the BIST may perform the operation test of the memory at high speed based on the control signal having a low speed.

Design of a memory chip in designing SiP products provided with the BISTs may be performed after the BIST has been designed. In the above case, since the operation test of the designed memory is performed after the BIST design has been completed, changing or adding the test pattern is not possible.

In addition to the operation test of the memory by the BIST, the test pattern may be improved without changing the BIST design by making it possible to perform an operation test in which an address signal supplied from an outside is loaded.

Figure 1:
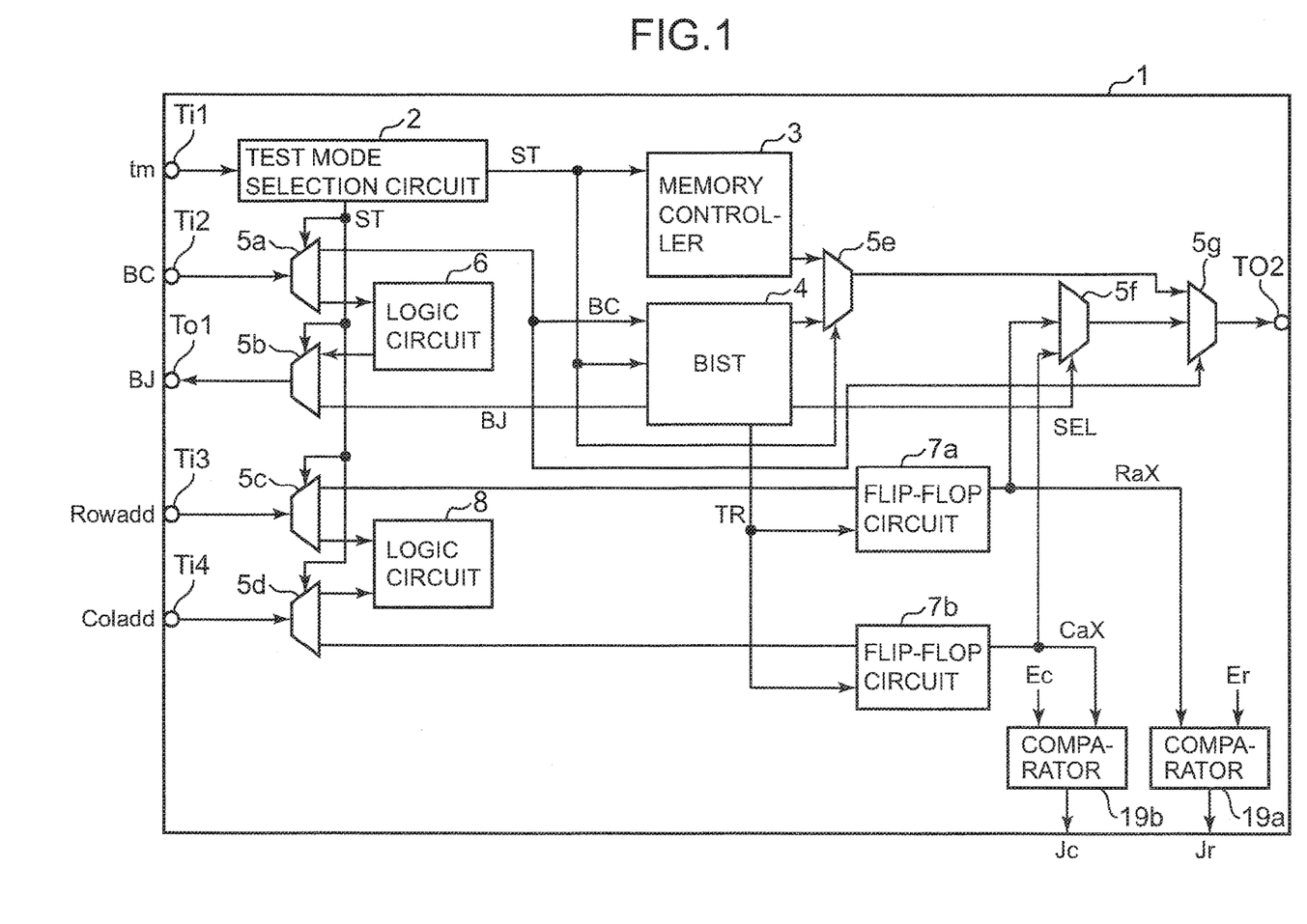
FIG. 1 shows a first embodiment.

FIG. 1 shows a first embodiment. A logic block 1 having a BIST 4 includes input terminals Ti1 to Ti4 and output terminals To1 and To2. A memory on which the operation test is performed by the logic block 1 is coupled to the output terminal To2.

A test mode signal tm to select a test mode is input to the input terminal Ti1 from a tester. The test mode signal tm is supplied to a test mode selection circuit 2. The test mode selection circuit 2 outputs a test mode setting signal ST to a memory controller 3, BIST 4, and selectors 5a to 5e based on the test mode signal tm.

A BIST control signal BC is input to the input terminal Ti2 from the tester, in the test mode. A normal logic signal is inputted to the input terminal Ti2, in a normal mode. The selector 5a outputs the BIST control signal BC to BIST 4, based on the test mode setting signal ST. The selector 5a outputs the normal logic signal, which is input to the input terminal Ti2, to a logic circuit 6 in the normal mode where the test mode setting signal ST is not input.

Based on the BIST control signal BC, any one of an automatic test mode where the operation test of the memory coupled to the output terminal To2 is performed based on the test pattern output from the BIST 4 and a direct access mode where the operation test of the memory coupled to the output terminal To2 is performed based on the address signal input from the outside is selected.

The selector 5b outputs a BIST judgment signal BJ, which is output from the BIST 4 based on the test mode setting signal ST in the test mode, to the output terminal To1. The selector 5b outputs the normal logic signal, which is output from the logic circuit 6 in the normal mode, to the output terminal To1.

A row address signal Rowadd of the memory is input to the input terminal Ti3, in the direct access mode. The normal logic signal is input to the input terminal Ti3, in the normal mode. The selector 5c outputs the row address signal Rowadd to a flip-flop circuit 7a based on the test mode setting signal ST in the test mode and outputs the normal logic signal to a logic circuit 8 in the normal mode.

A column address signal Coladd of the memory is input to the input terminal Ti4 in the direct access mode. The normal logic signal is input to the input terminal Ti4, in the normal mode. The selector 5d outputs the column address signal Coladd to a flip-flop circuit 7b based on the test mode setting signal ST, in the test mode and outputs the normal logic signal to the logic circuit 8, in the normal mode.

The memory controller 3 outputs a memory control signal controlling the memory operation, to the selector 5e, in the normal mode where the test mode signal tm is not input. When the automatic test mode is set based on the test mode setting signal ST and on the BIST control signal BC, the BIST 4 outputs the control signal for the operation test of the memory and an address signal corresponding to the test pattern, to the selector 5e.

When the direct access mode is set based on the test mode setting signal ST and on the BIST control signal BC, the BIST 4 outputs a memory control signal without including the address signal to the selector 5e. In addition, the BIST 4 generates a trigger signal TR based on a setting of the direct access mode and outputs the trigger signal TR, to the flip-flop circuits 7a and 7b.

The selector 5e outputs the output signal of the BIST 4 to a selector 5g if the test mode setting signal ST is input and the selector 5e outputs the output signal of the memory controller 3 to the selector 5g if the test mode setting signal ST is not input.

When the trigger signal TR is input to the flip-flop circuits 7a and 7b, the flip-flop circuits 7a and 7b latch the row address signal Rowadd and the column address signal Coladd output from the selectors 5c and 5d respectively and output them to a selector 5f, as a row address signal RaX and a column address signal CaX.

The selector 5f selects any one of the output signals of the flip-flop circuits 7a and 7b based on an address selection signal SEL supplied from the BIST 4, and outputs the selected signal to the selector 5g.

The selector 5g outputs the signal from the selector 5e or the signal from the selector 5f to the memory (not shown), from the output terminal To2, based on the BIST control signal BC.

Figure 2:
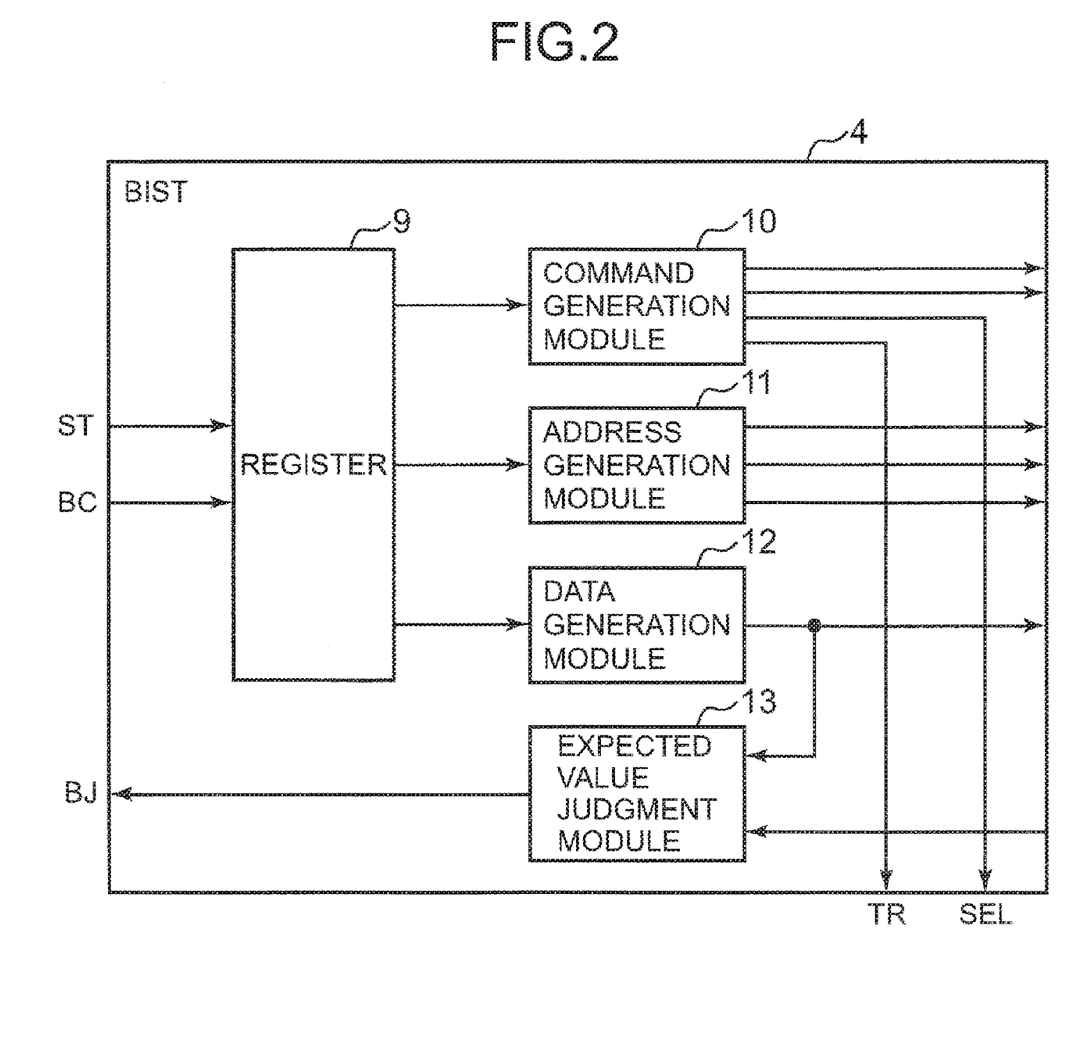
FIG. 2 shows a block diagram of a Built In Self Test (BIST)

FIG. 2 shows a block diagram of the BIST 4 shown in FIG. 1. The test mode setting signal ST and the BIST control signal BC are held in a register 9. When the automatic test mode is set based on the test mode setting signal ST and on the BIST control signal BC, a command generation module 10 outputs the memory control signal and the trigger signal TR, an address generation module 11 outputs the address signal corresponding to the test pattern, and a data generation module 12 outputs write data corresponding to the test pattern.

An expected value judgment module 13 compares the write data output from the data generation module 12 with the read data from a memory cell to which the write data is written, and outputs a comparison result as the BIST judgment signal BJ.

When the direct access mode is set based on the test mode setting signal ST and on the BIST control signal BC, the address generation module 11 stops outputting the address signal.

Figure 3:
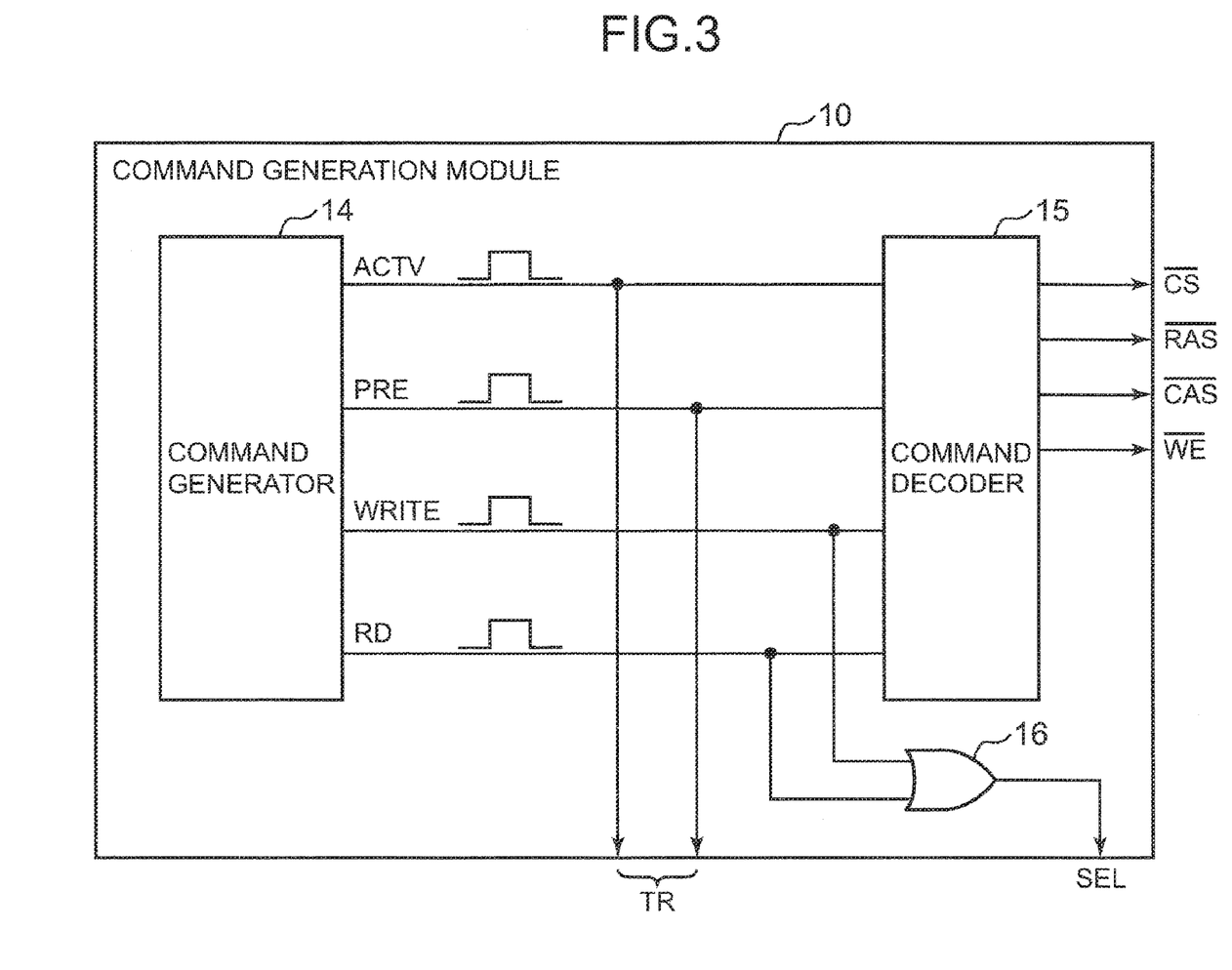
FIG. 3 shows a block diagram of a command generation module.

FIG. 3 shows a block diagram of the command generation module 10 shown in FIG. 2. A command generator 14 outputs an activation signal ACTV, a pre-charge signal PRE, a write signal WRITE, and a read signal RD to a command decoder 15, in the automatic test mode and the direct access mode.

The command decoder 15 outputs memory control signals /CS, /RAS, /CAS, and /WE based on the activation signal ACTV, the pre-charge signal PRE, the write signal WRITE, and on the read signal RD. The command generator 14 outputs the activation signal ACTV or the pre-charge signal PRE, as the trigger signal TR. The write signal WRITE and the read signal RD are input to an OR circuit 16 and the OR circuit 16 outputs the address selection signal SEL.

Figure 4:
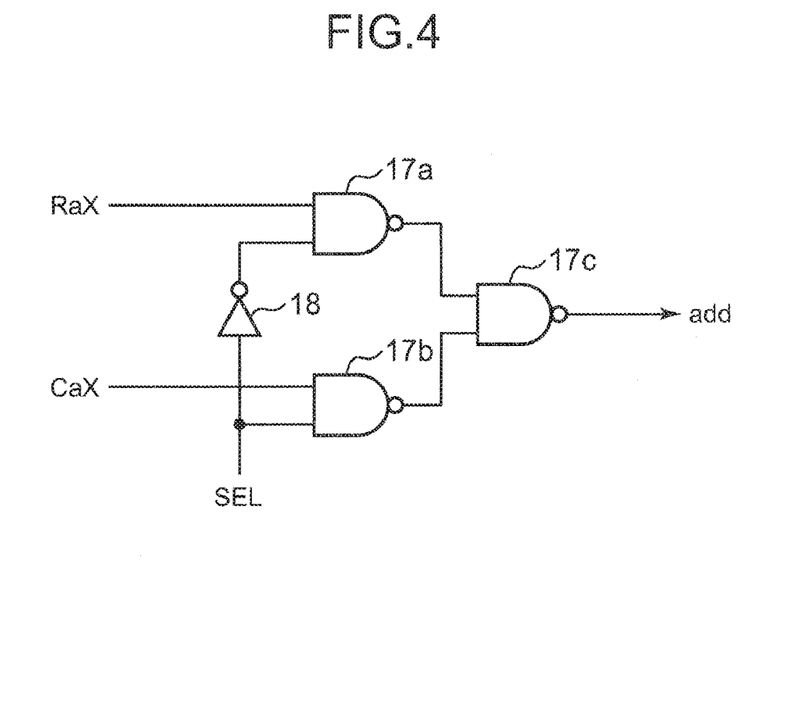
FIG. 4 shows a block diagram of a selector.

FIG. 4 shows a block diagram of the selector 5f shown in FIG. 1. The row address signal RaX output from the flip-flop circuit 7a in FIG. 1 is input to a NAND circuit 17a. The column address signal CaX output from the flip-flop circuit 7b in FIG. 1 is input to a NAND circuit 17b. The address selection signal SEL is input to the NAND circuit 17b and input to the NAND circuit 17a via an inverter circuit 18. The output signals from the NAND circuits 17a and 17b are input to a NAND circuit 17c.

If the address selection signal SEL becomes an L level, the row address signal RaX is output via the NAND circuits 17a and 17c, as an address signal add. If the address selection signal SEL becomes an H level, the column address signal CaX is output via the NAND circuits 17b and 17c, as the address signal add.

The selector shown in FIG. 4 selects a one-bit address signal, for descriptive purposes. In consequence, if outputting address signals of multiple bits in parallel, the selectors 5c, 5d, and 5f and the flip-flop circuits 7a and 7b need to be configured such that the address signals of multiple bits are output in parallel.

As shown in FIG. 1, the output signals RaX and CaX of the flip-flop circuits 7a and 7b are input to comparators 19a and 19b, respectively. The comparators 19a and 19b are verification circuits that verify whether setup times or hold times of the flip-flop circuits 7a and 7b are kept or not.

In the direct access mode, if a difference in timing is produced between the address signals Rowadd and Coladd input to the flip-flop circuits 7a and 7b from the input terminals Ti3 and Ti4 and the trigger signal TR, the setup or the hold times of the flip-flop circuits 7a and 7b may not be kept. As a result, it may occur that the flip-flop circuits 7a and 7b do not correctly latch the address signals Rowadd and Coladd.

To avoid this, the comparators 19a and 19b verifies the setup and the hold times based on a comparison between the output signals RaX and CaX of the flip-flop circuits 7a and 7b and an expected value output from the BIST 4.

Verification operations by the comparators 19a and 19b are performed prior to the start of the operation test of the memory in the direct access mode. The row address signal Rowadd for verification and the column address signal Coladd for verification are input to the input terminals Ti3 and Ti4. Expected values Er and Ec which coincide with the row address signal Rowadd for verification and the column address signal Coladd for verification are input from the BIST 4 to the comparators 19a and 19b.

Figure 5:
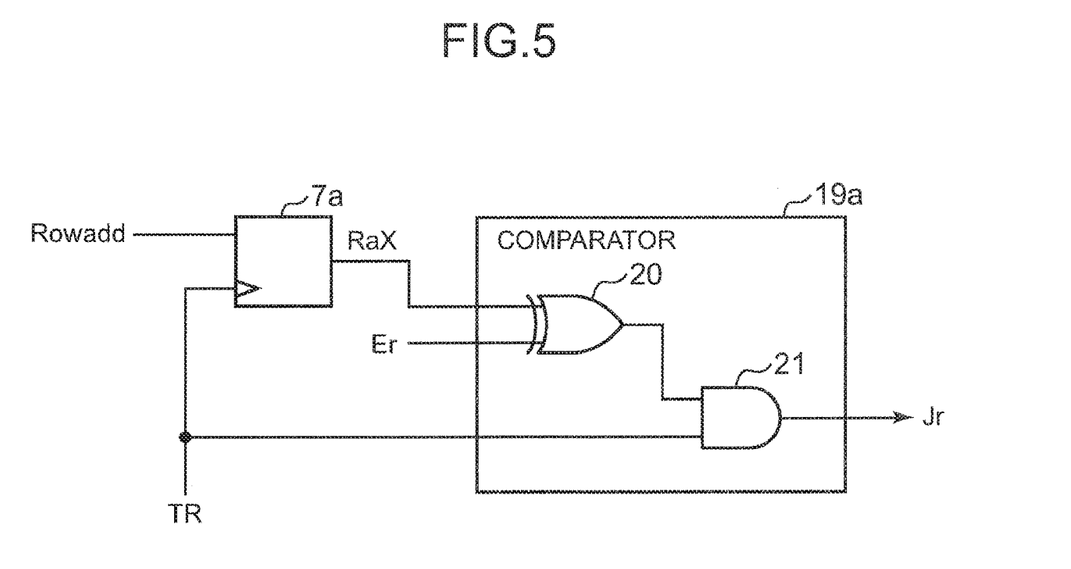
FIG. 5 shows a block diagram of a comparator.

FIG. 5 shows a block diagram of the comparators 19a and 19b shown in FIG. 1. Since the comparators 19a and 19b have the similar configuration, the comparator 19a will be disclosed.

The row address signal RaX latched by the flip-flop circuit 7a and the expected value Er are input to an EOR circuit 20. An output signal from the EOR circuit 20 is input to an AND circuit 21. The trigger signal TR is input to the AND circuit 21 and a judgment signal Jr is output from the AND circuit 21.

When the trigger signal TR becomes an H level, if the row address signal RaX and the expected value Er coincide with each other, the judgment signal Jr having an H level is output, and on the other hand, if the row address signal RaX and the expected value Er do not coincide with each other, the judgment signal Jr having an L level is output.

Figure 6:
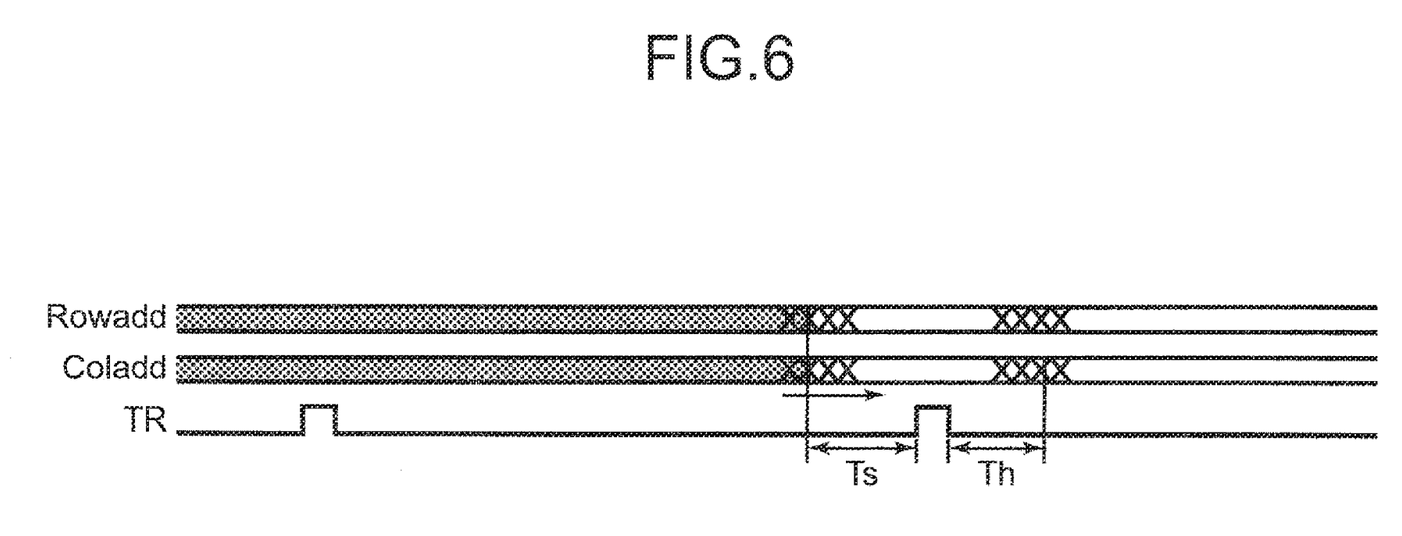
FIG. 6 shows a setup time and a hold time of a flip-flop circuit.

FIG. 6 shows the setup time and the hold time of the flip-flop circuit. As shown in FIG. 6, the comparators 19a and 19b shown in FIG. 1 judges whether a setup time Ts and a hold time Th are kept or not, based on switching timing of each of the row address signal Rowadd and the column address signal Coladd in the flip-flop circuits 7a and 7b and on timing of the trigger signal TR. The judgment signals Jr and Jc having the H level indicate that the setup time Ts and the hold time Th are kept. The judgment signals Jr and Jc having the L level indicate that at least any one of the setup time Ts and the hold time Th is not kept.

If the set up time Ts or the hold time Th is not kept, the judgment signals Jr and Jc are changed to the H level by adjusting input timing of the row address signal Rowadd for verification or the column address signal Coladd for verification, each of which is inputted to the input terminals Ti3 or Ti4 shown in FIG. 1. After adjusting the input timing, the address signal for the operation test of the memory in the direct access mode is input to the input terminals Ti3 and Ti4.

Figure 7:
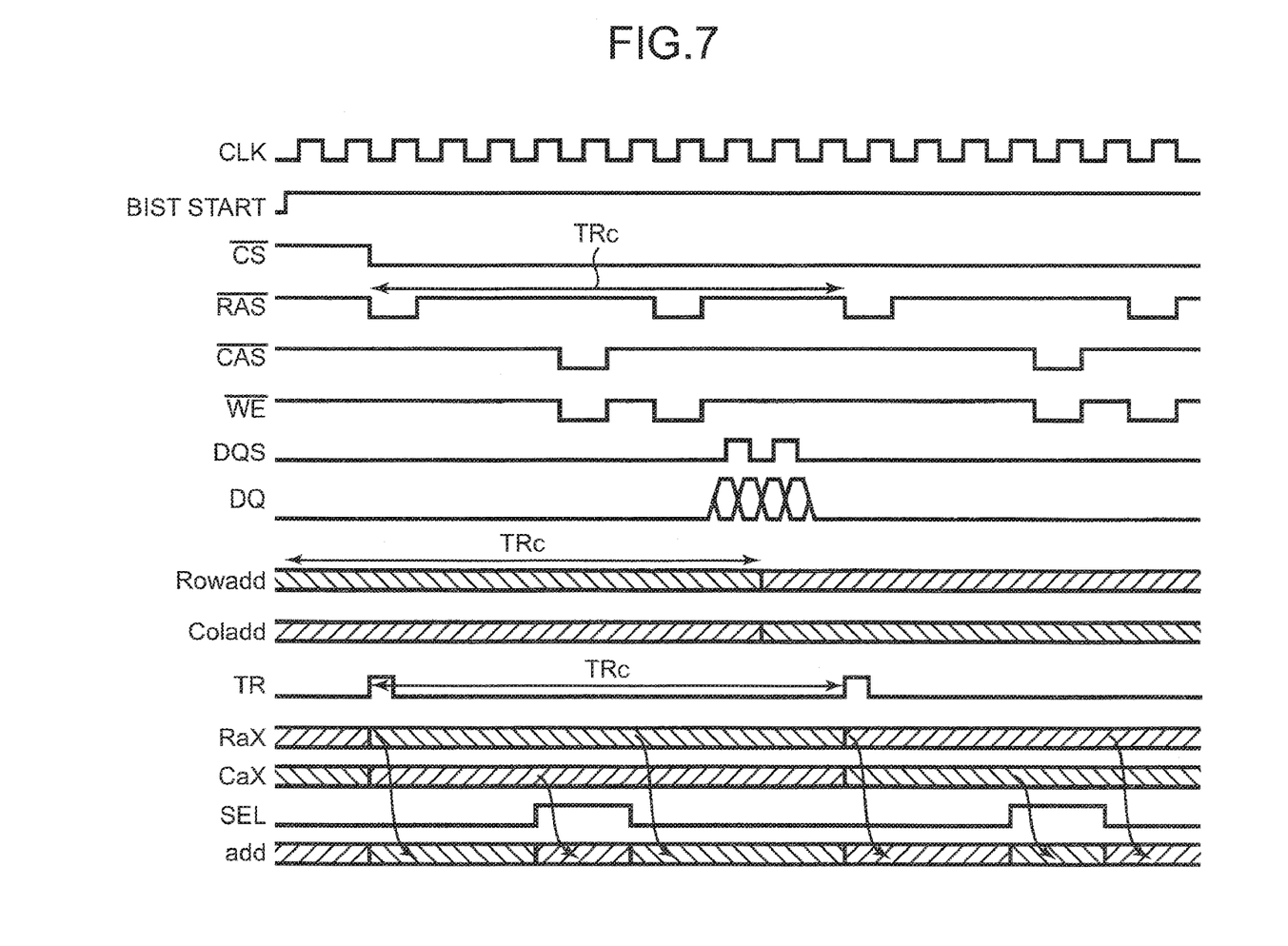
FIG. 7 shows an operation of a logic block in the first embodiment.

FIG. 7 shows an operation of the logic block 1 shown in FIG. 1. The direct access mode is set based on the test mode signal tm and on the BIST control signal BC. Upon starting the operation of the BIST 4 in FIG. 1 (BIST START) based on the setting of the direct access mode, the BIST 4 outputs the memory control signals /CS, /RAS, /CAS, and /WE and the write data for the operation test of the memory, to the selector 5e in FIG. 1, based on an internal clock signal CLK. The output of the address signals from the address generation module 11 (in FIG. 2) of the BIST 4 stops in the direct access mode.

The selector 5e in FIG. 1 selects the output signal of the BIST 4 based on the test mode setting signal ST, and outputs the selected signal to the selector 5g. The selector 5g outputs the output signal of the BIST 4 to the memory (not shown). A data write operation and a data read operation are performed in the memory, based on the memory control signals /CS, /RAS, /CAS, and /WE generated in the BIST 4.

The row address signal Rowadd and the column address signal Coladd are input in sequence to the input terminals Ti3 and Ti4 shown in FIG. 1 from the tester at a cycle equal to a cycle TRc of the trigger signal TR, in the direct access mode. The row address signal Rowadd and the column address signal Coladd are the address signals for the operation test of the memory with a test pattern different from the test pattern set in the BIST 4. The row address signal Rowadd and the column address signal Coladd are input, for example, as a signal of low speed which can be switched at intervals of 10 pulses of the internal clock signal CLK, in other words, at an interval equal to the cycle (TRc) of the trigger signal TR.

The row address signal Rowadd and the column address signal Coladd are inputted to the input terminals Ti3 and Ti4 shown in FIG. 1 and are inputted to the flip-flop circuits 7a and 7b via the selectors 5c and 5d. The row address signal Rowadd and the column address signal Coladd are latched by the flip-flop circuits 7a and 7b based on the trigger signal TR. The flip-flop circuits 7a and 7b output the row address signal Rowadd and the column address signal Coladd as the address signals RaX and CaX synchronized with the trigger signal TR, to the selector 5f.

The selector 5f shown in FIG. 1 alternately selects the row address signal RaX and the column address signal CaX, based on switching of the address selection signal SEL output from the command generation module 10 (in FIG. 2) of the BIST 4, and outputs the selected signal to the memory (not shown)

The write operation based on the test pattern set by the tester is performed, based on the memory control signals /CS, /RAS, /CAS, and /WE and the write data supplied from the BIST 4 and on the row address signal RaX and the column address signal CaX supplied from the flip-flop circuits 7a and 7b, in the memory (not shown).

After completion of the write operation, the read operation based on the test pattern set by the tester is performed, based on the memory control signals /CS, /RAS, /CAS, and /WE, the row address signal RaX and the column address signal CaX. The read data is compared with the write data in the expected value judgment module 13 (in FIG. 2) of the BIST 4 and the comparison result is output, as the BIST judgment signal BJ.

When the automatic test mode is set based on the test mode signal tm and on the BIST control signal BC, the memory control signals /CS, /RAS, /CAS, and /WE, the write data generated in the BIST 4 and a row address signal and a column address signal, which are generated in the address generation module 11 shown in FIG. 2, are supplied to the memory (not shown). The operation test of the memory (not shown) is performed based on the test pattern set in the BIST 4.

The logic block 1 as a test circuit shown in FIG. 1 selects the automatic test mode based on the address signal supplied from the BIST 4 and the direct access mode based on the address signal supplied from the tester. The logic block 1 produces a new test pattern based on the address signal input from the tester other than the test pattern set in the BIST 4. In the direct access mode, the first embodiment in which the operation test of the memory is performed with the test pattern that is different from the test pattern set in the BIST 4, based on the row address signal Rowadd and the column address signal Coladd input from the tester and on the memory control signals generated in the BIST 4, may expand the test pattern without changing the design of BIST 4. In the direct access mode, the address signal input from the tester is input at a lower speed in comparison with the address signal generated in the address generation module 11 (in FIG. 2) of the BIST 4 in the automatic test mode. In the direct access mode, the row address signal Rowadd and the column address signal Coladd input from the tester are input to the flip-flop circuits 7a and 7b via the selectors 5c and 5d shown in FIG. 1. The row address signal Rowadd and the column address signal Coladd are latched by the flip-flop circuits 7a and 7b based on the trigger signal TR output from the BIST 4 and output to the memory (not shown), as the address signals RaX and CaX. In consequence, the address signal input from the tester and the memory control signals generated in the BIST 4 may be synchronized, in the first embodiment. The row address signal RaX and column address signal CaX respectively are latched at the flip-flop circuits 7a and 7b and are output to the selector 5f. The selector 5f alternately selects the row address signal RaX and the column address signal CaX based on the address selection signal SEL output from the BIST 4 to output to the memory (not shown). Thus, the first embodiment may input the row address signal Rowadd and the column address signal Coladd from the tester in parallel. The comparators 19a and 19b in FIG. 1 verifies whether the setup times Ts and the hold times Th of the flip-flop circuits 7a and 7b are kept or not. If the setup time Ts or the hold time Th is not kept, the setup time TS and the hold time Th are adjusted by adjusting the timing of the row address signal Rowadd and the column address signal Coladd output from the tester.

Figure 8:
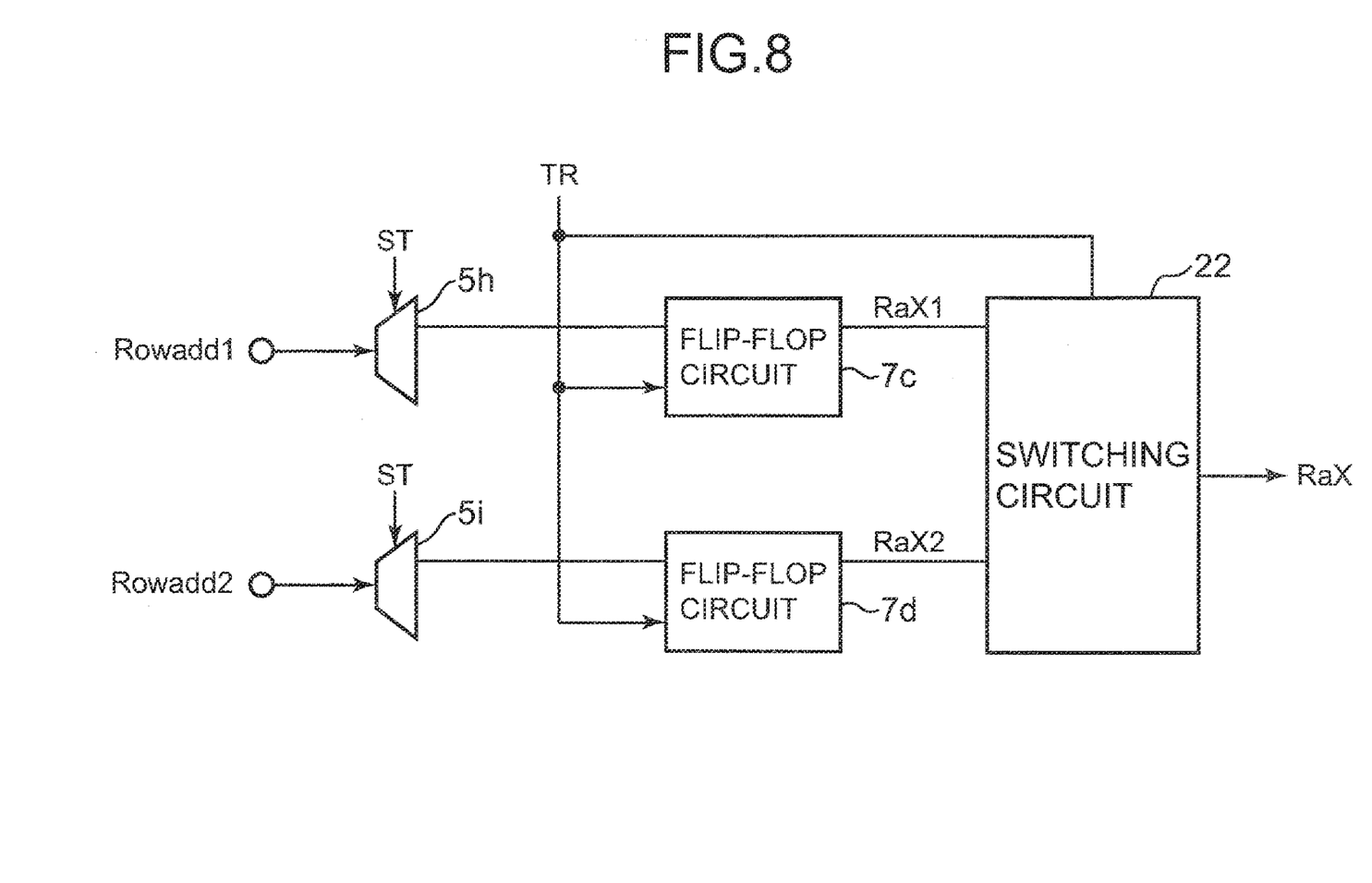
FIG. 8 shows a second embodiment.

FIG. 8 shows a second embodiment. In the second embodiment, a switching circuit is provided on a path that outputs an address signal to a memory in order to slow down an input of the address signal from a tester. The configuration other than the above in the second embodiment is the same or similar as that of the first embodiment. Two row address signals Rowadd1 and Rowadd2 input from the tester are input to flip-flop circuits 7c and 7d via selectors 5h and 5i in FIG. 8. The row address signals Rowadd1 and rowadd2 are two row address signals which are consecutively input.

The selectors 5h and 5i respectively select the row address signals Rowadd1 and Rowadd2 based on a test mode setting signal ST, and output the selected signal to the flip-flop circuits 7c and 7d.

The flip-flop circuits 7c and 7d latch the row address signals Rowadd1 and Rowadd2 respectively based on a trigger signal TR output from the BIST 4 shown in FIG. 1, and output the latched signals to a switching circuit 22.

As to a column address signal input from the tester, two address signals Coladd1 and Coladd2 consecutively input in the same manner are respectively latched by the flip-flop circuits 7c and 7d via the selectors 5h and 5i and are output to the switching circuit 22.

The respective address signals Rowadd1, Rowadd2, Coladd1, and Coladd2 input from the tester are switched once in every 20 pulses of an internal clock signal CLK of the BIST 4 shown in FIG. 1.

Figure 9:
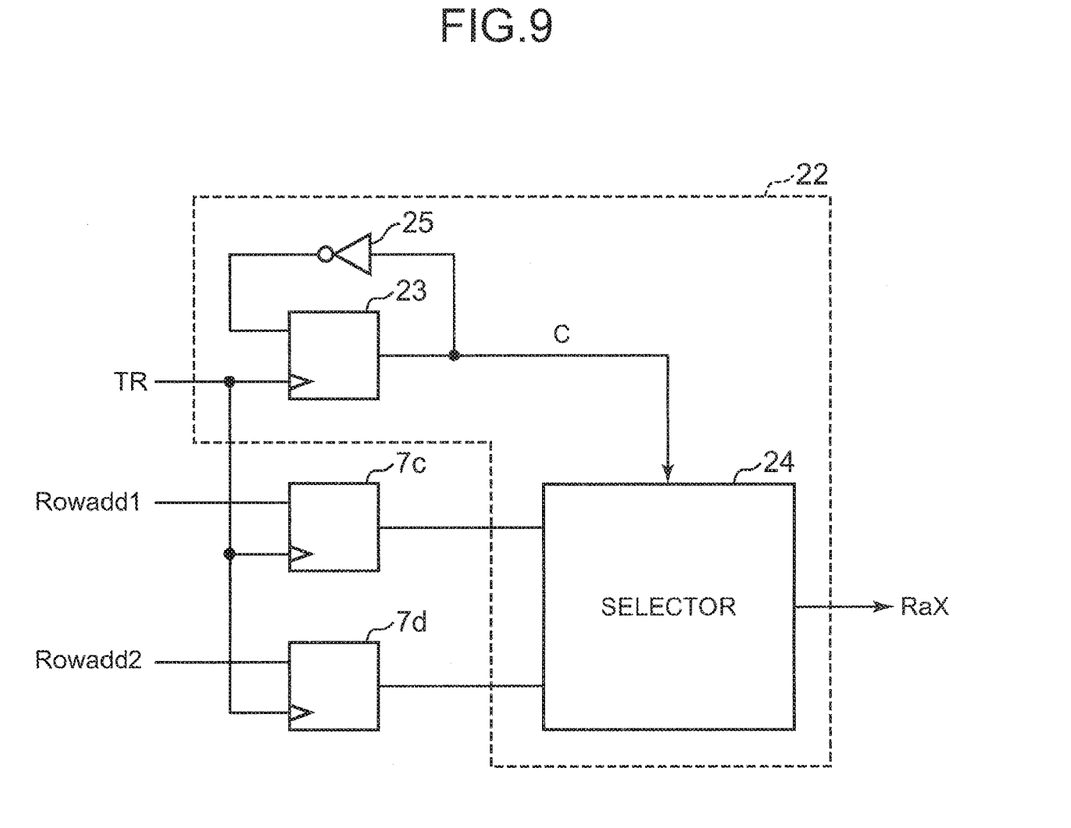
FIG. 9 shows a block diagram of a switching circuit.

FIG. 9 shows a block diagram of the switching circuit 22 shown in FIG. 8. As shown in FIG. 9, the switching circuit 22 includes a flip-flop circuit 23 and a selector 24. The trigger signal TR is input to the flip-flop circuit 23 as a clock signal. An output signal of the flip-flop circuit 23 is input as data to the flip-flop circuit 23 via an inverter circuit 25. Each time the trigger signal TR rises, the output signal of the flip-flop circuit 23 is input to the selector 24 as a switching signal C which is switched between an H level and an L level.

The output signals of the flip-flop circuits 7c and 7d are input to the selector 24. The selector 24 is configured similar to the circuit shown in FIG. 4 and alternately outputs the output signals of the flip-flop circuits 7c and 7d, based on switching of the switching signal C.

Figure 10:
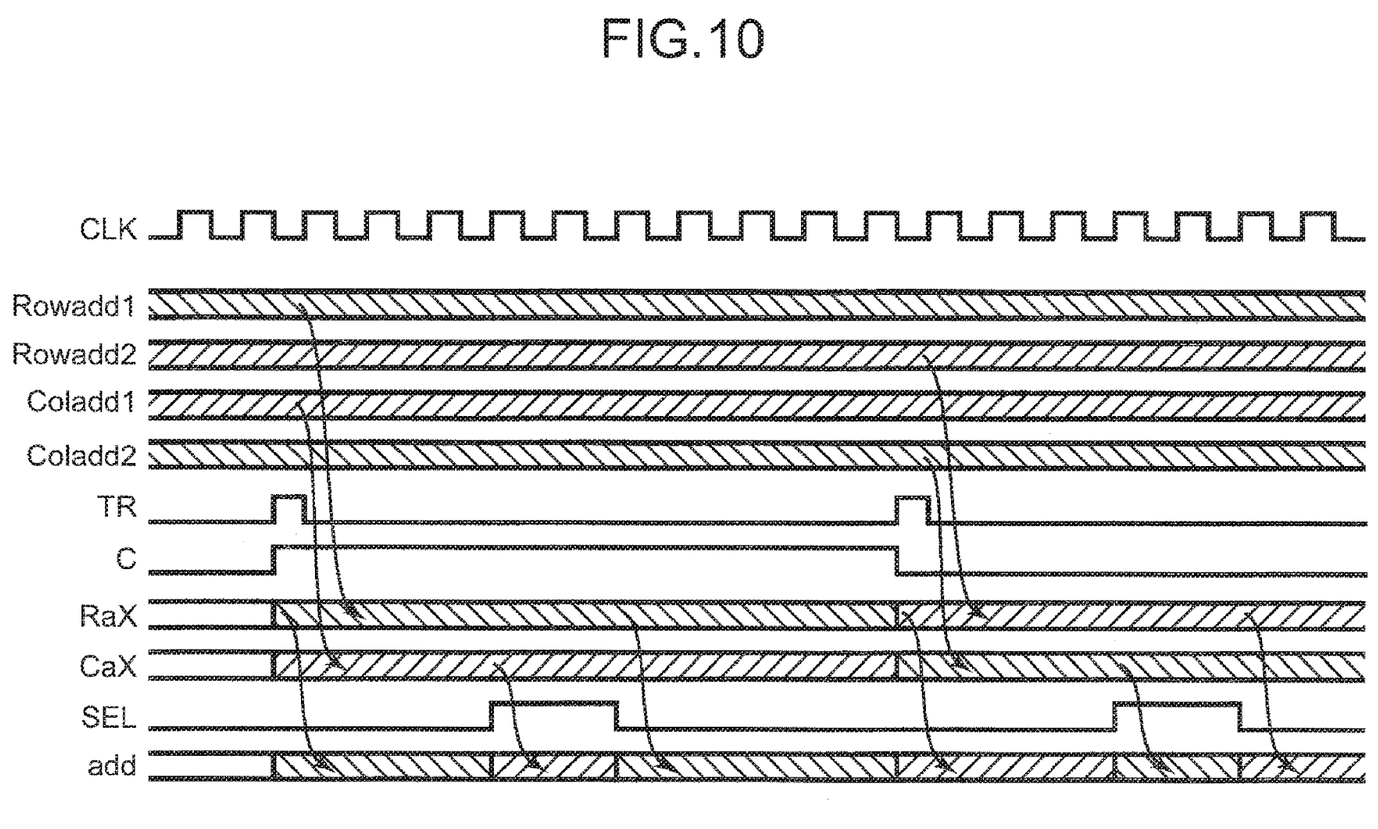
FIG. 10 shows an operation of a logic block in the second embodiment.

FIG. 10 shows an operation of a logic block of the second embodiment. A couple of row address signals Rowadd1 and Rowadd2 and a couple of column address signals Coladd1 and Coladd2 are input from the tester. Each time the trigger signal TR is input, the row address signals Rowadd1 and Rowadd2 are latched by the flip-flop circuits 7c and 7d and the column address signals Coladd1 and Coladd2 are latched by the flip-flop circuits 7c and 7d.

Each time the trigger signal TR is input, the switching signal C is switched. The switching circuit 22 switches row address signals RaX1 and RaX2 to output to the selector 5f and switches column addresses signals CaX1 and CaX2 to output to the selector 5f in the same manner.

The selector 5f shown in FIG. 1 alternately outputs the row address signals and the column address signals as an address signal add, based on an address selection signal SEL, to a memory (not shown), in the same manner as that in the first embodiment.

The logic block in the second embodiment has the same advantages as those in the first embodiment. The couple of row address signals consecutively input and the couple of column address signals consecutively input are respectively input to the latch circuits in parallel. The switching circuit 22 switches the respective address signals latched by the latch circuits to output in sequence. Thus, the second embodiment may perform an operation test of a memory at a speed equivalent to that of the first embodiment even if the input speed of the address signal input from the tester is decreased to a half of that of the first embodiment.

In each embodiment, the logic block 1 and the memory may be included in different packages, respectively. The logic block 1 and the memory may be provided on the different chips in the same package. The logic block 1 and the memory may be provided on the same chip in the same package.

Example embodiments of the present invention have now been described in accordance with the above advantages. It will be appreciated that these examples are merely illustrative of the invention. Many variations and modifications will be apparent to those skilled in the art.

The invention claimed is:

1. A semiconductor device including a logic circuit and a test circuit, the semiconductor device comprising:
   a logic signal terminal that supplies a first signal to the logic circuit;
   a latch circuit that latches a second signal based on a synchronization signal from the test circuit;
   a first selection circuit that supplies an external signal from the logic signal terminal to one of the logic circuit and the latch circuit selectively based on a test mode signal; and
   a second selection circuit that supplies one of the external signal from the latch circuit and a signal from the test circuit selectively to a memory.

2. The semiconductor device according to claim 1, wherein the test circuit generates the synchronization signal that synchronizes with an internal clock signal of the semiconductor device.

3. The semiconductor device according to claim 2, wherein a cycle in which the external signal is supplied is longer than a cycle of the internal clock signal of the semiconductor device.

4. The semiconductor device according to claim 1, further comprising:
   a memory controller; and
   a third selection circuit that supplies a third signal from the memory controller and a signal from the test circuit selectively to the second selection circuit.

5. The semiconductor device according to claim 1, wherein the external signal is an address signal and the address signal is supplied to the latch circuit.

6. The semiconductor device according to claim 1, further comprising:
   a plurality of latch circuits;
   a first latch circuit that latches a row address signal as the external signal; and
   a second latch circuit that latches a column address signal as the external signal.

7. The semiconductor device according to claim 6, further comprising:
   a fourth selection circuit that supplies one of the row address signal and the column address signal to the second selection circuit.

8. The semiconductor device according to claim 1, further comprising:
   a comparator that compares the external signal from the latch circuit with an expected value of the test circuit, wherein the comparator outputs a comparison result for adjusting a supply timing of the external signal.

9. The semiconductor device according to claim 1, further comprising:
   a plurality of latch circuits;
   a first latch circuit that latches a first row address signal as the external signal;
   a second latch circuit that latches a second row address signal as the external signal;
   a third selection circuit that selects one of the first row address signal and the second row address signal;
   a third latch circuit that latches a first column address signal as a second external signal;
   a fourth latch circuit that latches a second column address signal as the second external signal; and a fourth selection circuit that selects one of the first column address signal and the second column address signal.

10. A method of manufacturing a semiconductor device comprising:
supplying an external signal supplied from a logic signal terminal that supplies a first signal to a logic circuit and a latch circuit selectively;
outputting the external signal supplied to the latch circuit, based on a synchronization signal from a test circuit;
supplying one of the output external signal and a second signal from the test circuit selectively to a memory; and
performing a test of the memory based on the external signal and the second signal from the test circuit.

11. The method of manufacturing the semiconductor device according to claim 10, wherein the external signal is an address signal, wherein the address signal is supplied to the memory, wherein data is written to the memory and is read from the memory, and wherein the read data is compared with an expected value.

12. The method of manufacturing the semiconductor device according to claim 10, wherein the synchronization signal synchronizes with an internal clock signal of the semiconductor device and a cycle of the external signal is longer than a cycle of the internal clock signal.

13. The method of manufacturing the semiconductor device according to claim 10, wherein the signal from the test circuit is supplied to the memory in a test, and wherein a signal from a memory controller is supplied to the memory in a normal operation.

14. The method of manufacturing the semiconductor device according to claim 10, wherein the external signal is an address signal and the address signal is supplied to the latch circuit.

15. The method of manufacturing the semiconductor device according to claim 10 further comprising:
supplying a row address signal as the external signal to a first latch circuit;
supplying a column address signal as the external signal to a second latch circuit; and
supplying the row address signal and the column address signal selectively to the memory based on a selection signal from the test circuit.

16. A memory system comprising:
a semiconductor device that receives an external signal; and
a memory that receives a signal from the semiconductor device, wherein the semiconductor device further comprising:
a logic circuit that receives the external signal via a logic signal terminal;
a latch circuit that latches a signal based on a synchronization signal from a test circuit;
a first selection circuit that supplies the external signal from the logic signal terminal to one of the logic circuit and the latch circuit selectively, based on a test mode signal; and
a second selection circuit that selectively outputs one of the external signal from the latch circuit and a signal from the test circuit.

17. The memory system according to claim 16, wherein a cycle of the external signal is longer than a cycle of an internal clock signal of the semiconductor device.

18. The memory system according to claim 16, wherein the external signal and the test mode signal are supplied from an external device.

19. The memory system according to claim 16, wherein the external signal is an address signal and the test circuit outputs a comparison result between data of the memory corresponding to the address signal and an expected value of the test circuit.

20. The memory system according to claim 16, wherein the semiconductor device and the memory are packaged.

* * * * *